United States Patent
Hayashi

(10) Patent No.: US 9,373,562 B2
(45) Date of Patent: Jun. 21, 2016

(54) SEMICONDUCTOR DEVICE AND METHOD OF MANUFACTURING SEMICONDUCTOR DEVICE

(71) Applicant: TOYOTA JIDOSHA KABUSHIKI KAISHA, Toyota-shi, Aichi-ken (JP)

(72) Inventor: Shoji Hayashi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/641,500

(22) Filed: Mar. 9, 2015

(65) Prior Publication Data

US 2015/0270191 A1    Sep. 24, 2015

(30) Foreign Application Priority Data

Mar. 18, 2014   (JP) .................................. 2014-054701

(51) Int. Cl.
| | |
|---|---|
| H01L 23/10 | (2006.01) |
| H01L 23/367 | (2006.01) |
| H01L 21/56 | (2006.01) |
| H01L 23/31 | (2006.01) |
| H01L 23/00 | (2006.01) |

(52) U.S. Cl.
CPC ............ *H01L 23/3675* (2013.01); *H01L 21/56* (2013.01); *H01L 23/3107* (2013.01); *H01L 24/32* (2013.01); *H01L 24/83* (2013.01); *H01L 2224/26152* (2013.01); *H01L 2224/32245* (2013.01); *H01L 2224/83385* (2013.01); *H01L 2224/83801* (2013.01); *H01L 2924/181* (2013.01)

(58) Field of Classification Search
CPC ..... H01L 23/36; H01L 23/3675; H01L 24/32; H01L 23/3107; H01L 24/83; H01L 21/56
USPC ............................ 257/706, 707, 713, E23.051
See application file for complete search history.

(56) References Cited

U.S. PATENT DOCUMENTS

| | | | | | |
|---|---|---|---|---|---|
| 5,909,056 | A | * | 6/1999 | Mertol | H01L 23/24 257/704 |
| 5,977,626 | A | * | 11/1999 | Wang | H01L 23/3128 257/691 |
| 6,144,101 | A | * | 11/2000 | Akram | H01L 23/50 257/707 |
| 6,166,434 | A | * | 12/2000 | Desai | H01L 21/563 257/704 |
| 6,281,573 | B1 | * | 8/2001 | Atwood | H01L 23/3675 165/80.3 |
| 6,369,455 | B1 | * | 4/2002 | Ho | H01L 23/3128 257/730 |
| 7,078,800 | B2 | * | 7/2006 | Kwon | H01L 23/36 257/704 |
| 7,161,239 | B2 | * | 1/2007 | Zhao | H01L 23/24 257/706 |
| 8,362,607 | B2 | * | 1/2013 | Scheid | H01L 23/3675 257/704 |
| 2006/0096299 | A1 | | 5/2006 | Mamitsu et al. | |

FOREIGN PATENT DOCUMENTS

JP    2006-165534 A    6/2006

* cited by examiner

*Primary Examiner* — Nitin Parekh
(74) *Attorney, Agent, or Firm* — Oliff PLC

(57) ABSTRACT

A semiconductor device provided herewith includes a semiconductor substrate; a brazing material bonded to the semiconductor substrate; a heat sink connected to the semiconductor substrate via the brazing material and a resin. The heat sink includes a protruding portion formed outside of a range in which the heatsink is connected to the semiconductor substrate via the brazing material. The protruding portion is making contact with the brazing material. The resin seals the semiconductor substrate, the brazing material and the protruding portion.

2 Claims, 2 Drawing Sheets

SEMICONDUCTOR DEVICE AND METHOD OF MANUFACTURING SEMICONDUCTOR DEVICE

TECHNICAL FIELD

The present invention relates to a semiconductor device.

DESCRIPTION OF RELATED ART

Japanese Patent Application Publication No. 2006-165534 discloses a semiconductor device. In the semiconductor device, the lower surface of a semiconductor chip is soldered on a lower heat sink. The upper surface of the semiconductor chip is soldered on an upper heat sink. The semiconductor chip and the solders are sealed with a molding resin

BRIEF SUMMARY OF INVENTION

As described in Japanese Patent Application Publication No. 2006-165534, in a semiconductor device in which a semiconductor substrate is soldered on a heat sink, heat dissipation is desired to be more improved.

A semiconductor device disclosed in this specification comprises a semiconductor substrate, a brazing material, a heat sink, and a resin. The brazing material is bonded to the semiconductor substrate. The heat sink is connected to the semiconductor substrate via the brazing material and includes a protruding portion formed outside of a range in which the heat sink is connected to the semiconductor substrate via the brazing material. The protruding portion makes contact with the brazing material. The resin seals the semiconductor substrate, the brazing material, and the protruding portion.

In the semiconductor device, heat generated by the semiconductor substrate is transmitted to the heat sink through the brazing material. Since the protruding portion is in contact with the brazing material, the heat is also transmitted from the brazing material to the heat sink via the protruding portion. In this manner, in the semiconductor device, a path through which the heat is transmitted from the semiconductor substrate to the heat sink is wide. Thus, according to the semiconductor device, the temperature of the semiconductor substrate can be more preferably suppressed from increasing.

Furthermore, this specification discloses a method for manufacturing a semiconductor device. The method comprises molding a semi-finished product with resin. The semi-finished product comprises a semiconductor substrate, a brazing material bonded to the semiconductor substrate, and a heat sink connected to the semiconductor substrate via the brazing material. The heat sink includes a protruding portion formed outside of a range in which the heat sink is connected to the semiconductor substrate via the brazing material. The semiconductor substrate, the brazing material, and the protruding portion are sealed with the resin in the molding. The protruding portion becomes inclined in the molding due to a pressure of the resin so as to make contact with the brazing material.

According to the method, a semiconductor device in which the semiconductor substrate has a wide heat radiation path can be manufactured.

DETAILED DESCRIPTION OF INVENTION

Figure 1:
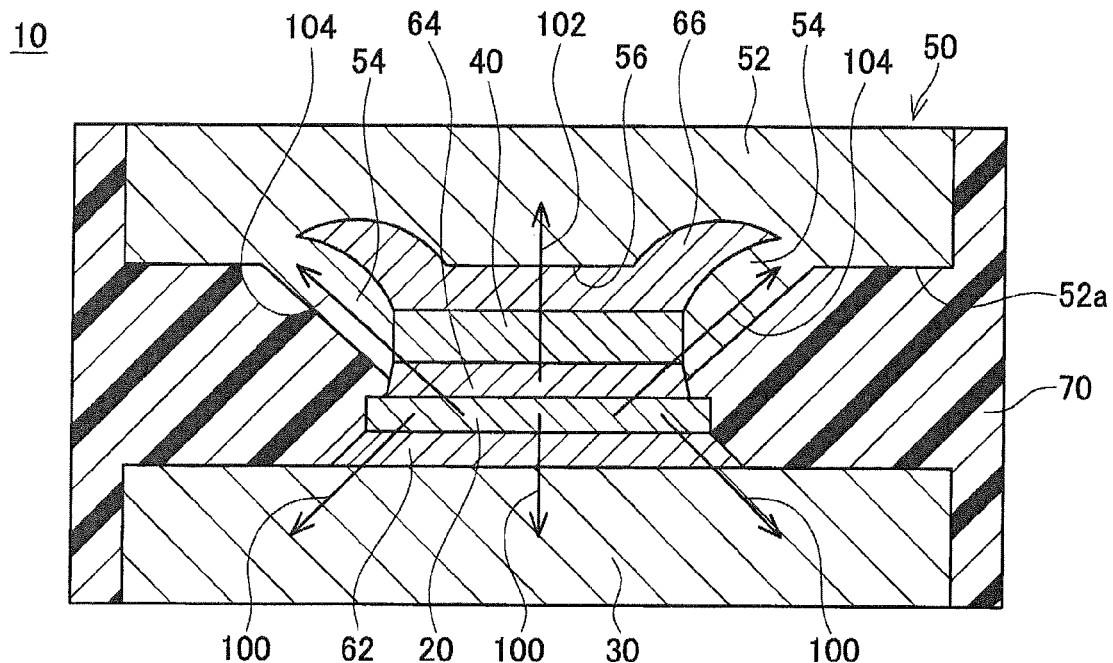
FIG. 1 is a longitudinal sectional view of a semiconductor device 10 according to an embodiment.

A semiconductor device 10 according to an embodiment shown in FIG. 1 has a semiconductor substrate 20, a lower heat sink 30, a spacer block 40, an upper heat sink 50, and a resin layer 70.

The semiconductor substrate 20 has a semiconductor layer, a lower electrode (not shown) formed on the lower surface of the semiconductor layer, and an upper electrode (not shown) formed on the upper surface of the semiconductor layer. The lower electrode is formed in an entire area of the lower surface of the semiconductor layer. The upper electrode is formed at a central portion of the upper surface of the semiconductor layer. More specifically, the area of the upper electrode is smaller than the area of the upper surface of the semiconductor layer.

The lower heat sink 30 is arranged on a lower side of the semiconductor substrate 20. The lower heat sink 30 is made of a metal such as Cu having high heat conductivity. The lower heat sink 30 is connected to the lower electrode of the semiconductor substrate 20 with a soldering layer 62 (i.e., brazing material). More specifically, the soldering layer 62 is bonded on the lower electrode of the semiconductor substrate 20 and bonded on the upper surface of the lower heat sink 30.

The spacer block 40 is arranged on the upper side of the semiconductor substrate 20. The spacer block 40 is made of a metal such as Cu having high heat conductivity. The spacer block 40 is connected to the upper electrode of the semiconductor substrate 20 with a soldering layer 64. More specifically, the soldering layer 64 is bonded on the upper electrode of the semiconductor substrate 20 and bonded on the lower surface of the spacer block 40.

The upper heat sink 50 is arranged on the upper side of the spacer block 40. The upper heat sink 50 is made of a metal such as Cu having high heat conductivity. The upper heat sink 50 has a main body 52 and two protruding portions 54, The two protruding portions 54 protrude downward from a lower surface 52a of the main body 52. On the lower surface 52a, a region sandwiched by the two protruding portions 54 serves as a mounting surface 56 to mount the spacer block 40 thereon. The mounting surface 56 is connected to the upper surface of the spacer block 40 with a soldering layer 66. More specifically, the soldering layer 66 is bonded on the upper surface of the spacer block 40 and bonded on the mounting surface 56 of the upper heat sink 50. Each of the protruding portions 54 is inclined toward the spacer block 40. The distal end of each of the protruding portions 54 is in contact with the soldering layer 64 and the spacer block 40. Although not shown, on the upper surface of the semiconductor substrate 20, in addition to the upper electrode described above, a signal input/output electrode (not shown) is formed. Since the upper heat sink 50 is connected to the upper electrode of the semiconductor substrate 20 via the spacer block 40 as described above, the upper heat sink 50 is prevented from being in contact with the signal input/output electrode and a wiring.

The resin layer 70 covers the upper surface of the lower heat sink 30, the soldering layer 62, the semiconductor substrate 20, the soldering layer 64, the spacer block 40, the soldering layer 66, and the lower surface of the upper heat sink 50.

The lower heat sink 30 and the upper heat sink 50 also serve as electrodes to electrically conduct the semiconductor substrate 20. When the semiconductor substrate 20 is electrically conducted, the semiconductor substrate 20 generates heat. The heat generated by the semiconductor substrate 20 is transmitted to the lower heat sink 30 through a path indicated by arrows 100 in FIG. 1. Since the lower electrode of the semiconductor substrate 20 is formed in the entire area of the lower surface of the semiconductor substrate 20, as indicated by the arrows 100, heat is transmitted from the semiconductor substrate 20 to the lower heat sink 30 while being diffused. Thus, the heat is efficiently transmitted from the semiconductor substrate 20 to the lower heat sink 30.

The heat generated by the semiconductor substrate 20 is transmitted to the upper heat sink 50 through a path indicated by an arrow 102 in FIG. 1. Furthermore, since the protruding portions 54 are in contact with the soldering layer 64 and the spacer block 40, the heat is also transmitted from the semiconductor substrate 20 to the upper heat sink 50 through a path indicated by arrows 104. In this manner, in the semiconductor device 10, the heat radiation path on the upper side is not limited to the spacer block 40, and the heat is also transmitted to the upper heat sink 50 through a path via the protruding portions 54. For this reason, as indicated by the arrows 102 and 104, the heat is transmitted from the semiconductor substrate 20 to the upper heat sink 50 while being diffused. Thus, the heat is efficiently transmitted from the semiconductor substrate 20 to the upper heat sink 50.

As described above, in the semiconductor device 10, even though the upper electrode of the semiconductor substrate 20 has a small area, heat can be efficiently transmitted from the semiconductor substrate 20 to the upper heat sink 50. Thus, in the semiconductor device 10, the temperature of the semiconductor substrate 20 can be effectively suppressed from increasing.

Figure 2:
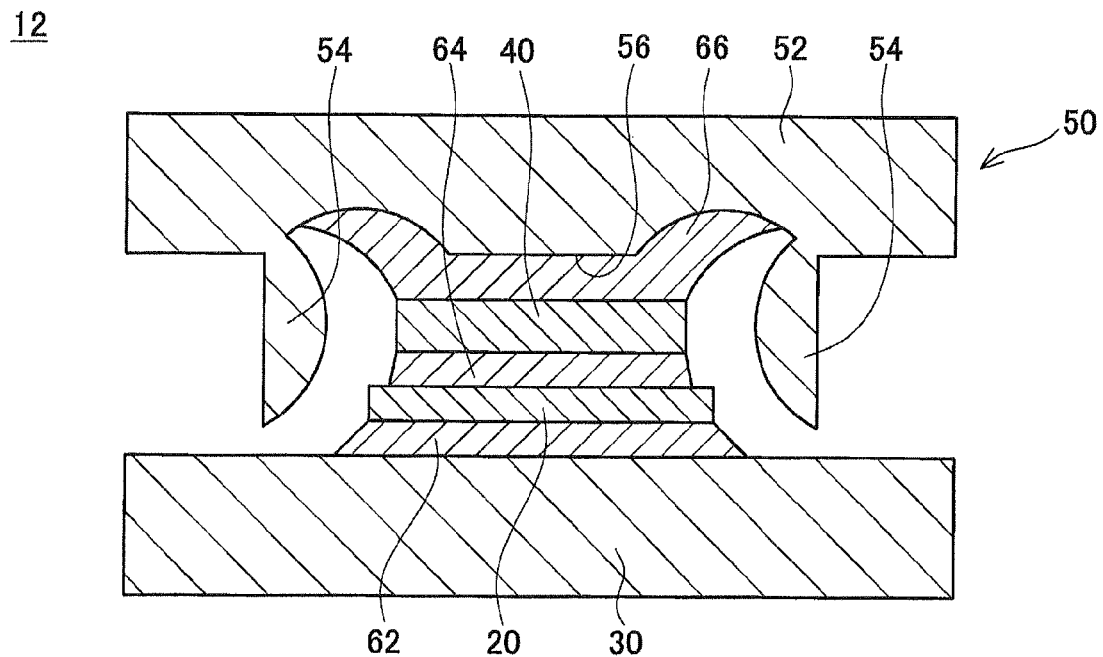
FIG. 2 is a diagram for explaining steps in manufacturing the semiconductor device 10 according to the embodiment.

A method of manufacturing the semiconductor device 10 will be described below. The upper heat sink 50 shown in FIG. 2 is prepared. In this stage, the protruding portions 54 of the upper heat sink 50 stand almost perpendicular to the lower surface 52a. By soldering, as shown in FIG. 2, the upper heat sink 50, the spacer block 40, the semiconductor substrate 20, and the lower heat sink 30 are connected to each other. More specifically, with the soldering layer 62, the lower electrode of the semiconductor substrate 20 is connected to the upper surface of the lower heat sink 30. With the soldering layer 64, the upper electrode of the semiconductor substrate 20 is connected to the lower surface of the spacer block 40. With the soldering layer 66, the upper surface of the spacer block 40 is connected to the mounting surface 56 of the upper heat sink 50. The member shown in FIG. 2 will be called a semi-finished product 12 hereinafter.

Figure 3:
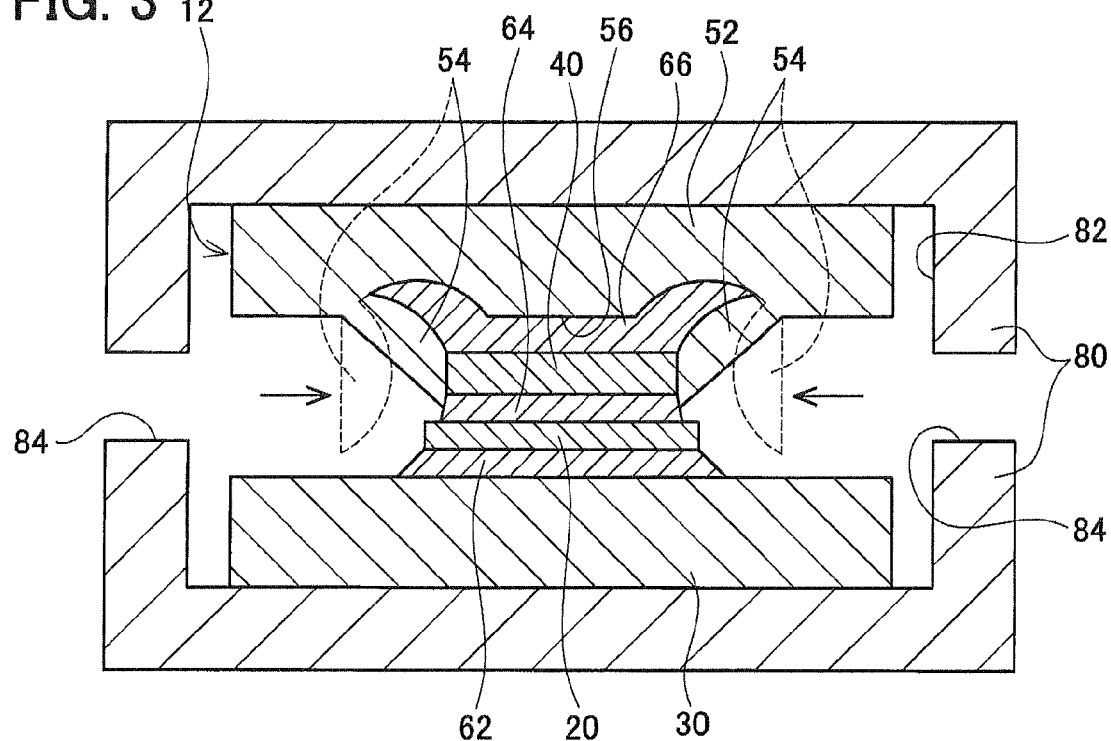
FIG. 3 is a diagram for explaining steps in manufacturing the semiconductor device 10 according to the embodiment.

As shown in FIG. 3, the semi-finished product 12 is arranged in a cavity 82 of a shaping die 80. In the shaping die 80, a runner 84 connected to the cavity 82 is formed. Each of the protruding portions 54 is set at a position facing the runner 84. More specifically, an outer surface (more specifically, a surface opposite to a surface facing the spacer block 40) of each of the protruding portions 54 faces the runner 84. A resin is filled in the cavity 82 through the runner 84. At this time, a pressure of resin flowing from the runner 84 into the cavity 82 transforms the protruding portions 54 to incline the protruding portions 54 toward the spacer block 40 as shown in FIG. 3. More specifically, the protruding portions 54 is pushed and moved with the resin. As a result, the distal end of each of the protruding portions 54 is in contact with the soldering layer 62 and the spacer block 40. In this manner, when the protruding portions 54 are inclined toward the spacer block 40 by being pushed with the resin, even though the thickness and the position (especially, a position in a vertical direction in FIG. 3) of the spacer block 40 vary (have errors), the protruding portions 54 can be reliably in contact with the spacer block 40 and the soldering layer 62. The resin filled in the cavity 82 covers the upper surface of the lower heat sink 30, the soldering layer 62, the semiconductor substrate 20, the soldering layer 64, the spacer block 40, the soldering layer 66, and the lower surface of the upper heat sink 50. The resin filled in the cavity 82 is solidified to form the resin layer 70 in FIG. 1. In this manner, the semiconductor device 10 in FIG. 1 is completed.

Figure 4:
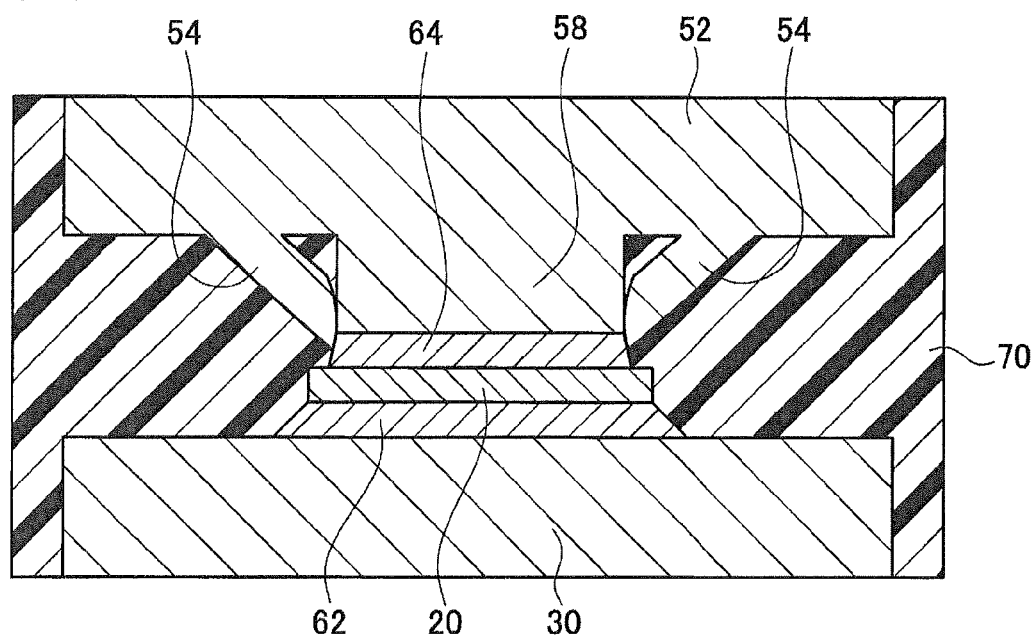
FIG. 4 is a longitudinal sectional view of a semiconductor device according to a modification.

In the embodiment described above, the semiconductor substrate 20 is connected to the upper heat sink 50 via the spacer block 40. However, the spacer block 40 may be omitted and the semiconductor substrate 20 may be connected to the upper heat sink 50 via only the soldering layer. For example, as shown in FIG. 4, a convex pedestal 58 is arranged on the upper heat sink 50, and the semiconductor substrate 20 may be connected to the pedestal 58 by a soldering layer 68. Even in this configuration, the upper heat sink 50 can be prevented from being in contact with electrodes and wirings for signal control on the upper surface of the semiconductor substrate 20. Furthermore, even in this configuration, the protruding portions 54 are in contact with the soldering layer 68 to make it possible to effectively radiate heat from the semiconductor substrate 20 to the upper heat sink 50.

The specific examples of the present invention were explained in detail as above, but these are only exemplification and are not intended to limit the claims. The technology described in the claims includes various variations and changes of the specific examples exemplified above.

The technical elements explained in this description or the drawings exert technical usability singularly or in various combinations and are not intended to be limited to the combination described in the claims at filing. Moreover, the technology exemplified in this description or the drawings is to achieve a plurality of objects at the same time, and achievement of one of them itself has technical usability.

What is claimed is:
1. A semiconductor device comprising:
   a semiconductor substrate;
   a brazing material bonded to the semiconductor substrate;
   a heat sink connected to the semiconductor substrate via the brazing material and including a protruding portion formed outside of a range in which the heat sink is connected to the semiconductor substrate via the brazing material, the protruding portion making contact with the brazing material;
   resin sealing the semiconductor substrate, the brazing material, and the protruding portion; and
   a spacer block located between the heat sink and the brazing material,
   wherein
   the heat sink is connected to the semiconductor substrate via the spacer block and the brazing material, and
   the protruding portion makes contact with the brazing material and the spacer block.

2. A method for manufacturing a semiconductor device, the method comprising:
   forming a semiconductor substrate, a brazing material bonded to the semiconductor substrate, and a heat sink connected to the semiconductor substrate via the brazing material,
   the heat sink includes a protruding portion formed outside of a range in which the heat sink is connected to the semiconductor substrate via the brazing material, the protruding portion making contact with the brazing material, the semiconductor substrate, the brazing material, and the protruding portion are sealed with resin; and a spacer block located between the heat sink and the brazing material, wherein the heat sink is connected to the semiconductor substrate via the spacer block and the brazing material, and the protruding portion makes contact with the brazing material and the spacer block.

* * * * *